United States Patent [19]
Ito et al.

[11] 3,891,468
[45] June 24, 1975

[54] METHOD OF MANUFACTURING SEMICONDUCTOR DEVICE

[75] Inventors: Katsuhiko Ito, Kokubunji; Takashi Tsuchimoto, Kodaira, both of Japan

[73] Assignee: Hitachi, Ltd., Japan

[22] Filed: Sept. 20, 1973

[21] Appl. No.: 399,115

[30] Foreign Application Priority Data

Sept. 20, 1972 Japan .............................. 47-93600

[52] U.S. Cl. .................... 148/1.5; 148/175; 357/91
[51] Int. Cl. ............................................ H01l 7/54
[58] Field of Search ............ 148/1.5, 175; 317/234, 317/235

[56] References Cited

UNITED STATES PATENTS

| | | | |
|---|---|---|---|
| 3,725,136 | 4/1973 | Morgan | 148/1.5 |
| 3,756,862 | 9/1973 | Ahn et al. | 148/1.5 |
| 3,789,504 | 2/1974 | Jaddam | 148/1.5 X |

OTHER PUBLICATIONS

Double et al., "FET Gate Integrity by Ion Implantation," IBM Tech. Discl. Bull., Vol. 16, No. 1, June 1973, p. 8.

*Primary Examiner*—L. Dewayne Rutledge
*Assistant Examiner*—J. M. Davis
*Attorney, Agent, or Firm*—Craig & Antonelli

[57] ABSTRACT

A method of forming a shallow P-N junction under precise control of its position. An impurity doped layer of the first conductivity type is formed, so that the impurity concentration may become a maximum at substantially the surface of a semiconductor substrate or at an inner part of the semiconductor substrate. Ions of impurities of a second conductivity type, opposite to the first conductivity type, are implanted, so that the impurity concentration may become a maximum greatest at the maximum depletion layer thickness in the semiconductor substrate. The P-N junction finally formed is located within the maximum depletion layer thickness.

10 Claims, 15 Drawing Figures

METHOD OF MANUFACTURING SEMICONDUCTOR DEVICE

BACKGROUND OF THE INVENTION

1. Field of the Invention

The present invention relates to a method of manufacturing a semiconductor device, and is mainly directed to a P-channel depletion type MOS field-effect transistor.

2. Description of the Prior Art

In the latest MOS type semiconductor integrated circuits, there has been developed the E/D (enhancement/depletion) circuit system in which MOS field-effect transistors of the enhancement and depletion types of the P-channel are combined in a single circuit. In this system, the depletion type MOS transistor is utilized as a load transistor or the like. The threshold voltage $V_T$ of this transistor is controlled, whereby improvements can be made so as to reduce the power consumption and shorten the delay time of the MOS type semiconductor integrated circuit. In this case, the field-effect transistors of the two types, the enhancement type and the depletion type, of P-channel type, must be assembled within the same semiconductor substrate. In general, an MOS transistor of the P-channel enhancement type is produced by merely forming P-type source and drain regions in an N-type semiconductor substrate. On the other hand, an MOS transistor of the P-channel depletion type requires, in order to form a P-channel depletion region, the manufacturing step of doping P-type impurities into a channel portion, so as to control the threshold voltage $V_T$.

As such a method of controlling the voltage $V_T$ by impurity doping, ion implantation techniques have hitherto been known. To cite an example of an application in the manufacturing process of an MOS field-effect transistor, there has been reported a method in which, for the control of the threshold voltage $V_T$ of the gate, ions are implanted with such implantation energy that the impurity ions arrive only at the channel region, (John Macdougall, "Ion Implantation offers a bagful of benefits for MOS," Electronics, June 22, 1970).

Previous to the suggestion of the present invention, the applicants have reported a method in which, in the control of the threshold gate voltage $V_T$ by ion implantation, variations in the quantity of doping by implantation are restrained against dispersions or variations in the thickness of gate oxide films and the implantation energy of the implanting operations, thereby attaining a high precision for the threshold gate voltage $V_T$ (Japanese Patent Application No. 7426 of 1971 filed on Feb. 19, 1971, entitled "Method of Manufacturing Semiconductor Device."

In more detail, the application contains the following description. According to the conventional method which makes use of the backside slope of an implanted impurity distribution as shown at (A) in FIG. 9 of the accompanying drawings, the threshold voltage $V_T$ varies largely on account of the dispersions of the thickness of gate oxide films or the variations of the ion implanting energy. In contrast, the threshold voltage varies only slighly and can be controlled with high precision, if ions are implanted, so that the maximum value of the impurity concentration distribution by ion implantation may be located substantially at the silicon substrate surface or located inside the semiconductor substrate beyond the surface as is illustrated at (B) or (C) in FIG. 9.

The inventors thought of exploiting the high-precision control method of the threshold gate voltage $V_T$ for the E/D system MOS type integrated circuit. Experiments of implanting ions of P-type impurities into the channel region of the P-channel enhancement type MOS transistor were carried out. Then, the following facts were revealed (refer to FIG. 6):

(1) As the quantity of impurities introduced by ion implantation into the channel region increases, the gate voltage - drain current characteristic ($V_G$ - $I_{DS}$ characteristic) moves in a parallel manner, and the threshold voltage $V_T$ decreases. (2) When the quantity of introduced impurities is further increased, the threshold voltage $V_T$ takes on positive values, and the operational mode changes to the depletion type. (3) When the quantity of introduced impurities is further increased, so that the threshold voltage $V_T$ may become approximately (+) 3 V, a source-drain leakage current $I_{DSL}$ arises, which cannot be controlled by the gate voltage.

The leakage current becomes a cause of useless power consumption in the transistor. Moreover, it brings about a lowering of the density of integration, and gives rise to inconveniences in the operation of an integrated circuit. The cause by which such leakage current is generated is considered as below. In the MOS field-effect transistor, the depth from its surface by which the control is made by the field effect is subject to limitations. This depth from the surface is generally termed the maximum surface depletion layer depth (or thickness) $x_{dmax}$, and is given by the following expression: $x_{dmax} \cong \sqrt{4\, \epsilon_s\, \epsilon_o\, \phi_F / q\, N_A}$ (where $\phi_F$ is the Fermi potential, $N_A$ is the impurity concentration, $\epsilon_s$ is the specific inductivity of the semiconductor, $\epsilon_o$ is the permittivity of a vacuum, and $q$ is the electronic charge).

FIG. 7 illustrates the impurity distribution $N_A$ of a P-N junction where boron ions, being a P-type impurity element, were implanted into an N-type silicon semiconductor with a substrate impurity concentration $N_{DS} = 2 \times 10^{15}$ cm$^{-3}$, at an accelerating voltage of 31 KeV, at a surface density of $10 \times 10^{11}$ per cm$^2$. The impurity concentration distribution $N_A$ is calculated on the basis of the LSS (Lindhard, Scharff and Schift) theory. The junction depth $x_j$ becomes approximately 1,700 A. Accordingly, as illustrated in FIG. 8, that partial region 7' of a P-channel region 7 which extends between the maximum surface depletion layer depth $x_{dmax}$ and the junction depth $x_j$ is not controlled by the field effect of the gate. The aforesaid leakage current flows through the P-type passage 7'. (In FIG. 7, $x_{dmax} \cong 1{,}000$ A is calculated by approximation, assuming that the impurity concentration is constant in the depth direction and $N_A = 10^{17}$ cm$^{-3}$.) As thus far described, the uncontrollable channel region of the P-type which is not controlled by the field effect of the gate is the cause of the leakage current.

Summary of the Invention

On the basis of the discovery of the cause by which the leakage current occurs, the present invention provides a method for diminishing the leakage current.

An object of the present invention is to reduce the leakage current by ion implantation in a P-channel depletion type MOS field-effect transistor.

Another object of the present invention is to provide a method of accurately controlling the threshold voltage $V_T$ of an MOS semiconductor device.

The fundamental construction of the present invention for accomplishing the objects is characterized, in a method of manufacturing a semiconductor device, by at least the first step of forming a doped layer of impurities of a first conductivity type, so that the maximum value of the varying concentration of the first conductivity type impurities may occur substantially at the surface portion of a semiconductor substrate or at an inner portion of the substrate, and the second step of implanting impurity ions of the second conductivity type opposite to the first conductivity type so that the varying concentration of the second conductivity type impurities may become a maximum at an inner part of the substrate, the impurity concentration of the doped layer formed by the second step having a smaller value at the surface of the substrate than the impurity concentration of the doped layer formed by the first step.

Another construction of the present invention is characterized, in the manufacture of a P-channel depletion type MOS semiconductor device, in that a P-type impurity doped layer is formed in an N-type semiconductor substrate with an insulating film on its surface, so that the maximum value of the impurity concentration distribution may be exhibited substantially at the interface part between the substrate and the insulating film or within the maximum surface depletion layer depth inside the substrate. Further, the N-type impurities of a quantity necessary for compensating a P-type impurity concentration of the P-type impurity doped layer in the vicinity of the maximum depletion layer depth are subjected to ion implantation, so that the maximum value of an impurity distribution may occur in the vicinity of the maximum depletion layer depth.

According to the constructions stated above, the P-type impurities in that region in the P-type impurity doped layer which is deeper than the maximum depletion layer depth are nullified, and the new P-N junction comes toward the surface from or beyond the maximum depletion layer depth. The leakage current between a source and a drain between which such P-type impurity doped layer is held as a channel region is greatly reduced. Also, at this time, the amount of N-type impurities is extremely small at the substrate surface, and can be neglected relative to the P-type impurities which have a maximum value of impurity concentration distribution at the substrate surface part or in the vicinity thereof. The threshold gate voltage $V_T$ is hardly affected by the ion implantation of the N-type impurities. This has been verified from a number of experimental results.

Brief Description of the Drawings

FIGS. 6 and 7 serve to explain the principle of the construction of the present invention, in which FIG. 6 is a diagram of source-drain current - gate voltage curves, while FIG. 7 is a diagram of impurity concentration distribution curves;

Preferred Embodiments of the Invention

Figure 1A:
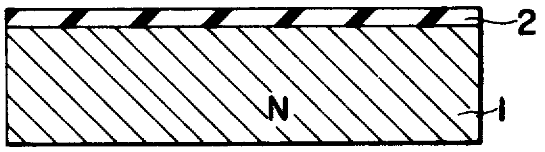
FIGS. 1*a* to 1*e* are vertical sectional views of a semiconductor device at various steps of a manufacturing process of an embodiment of the present invention.
Figure 1B:
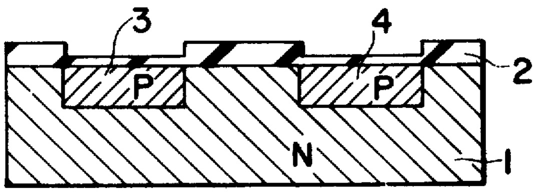
Figure 1C:
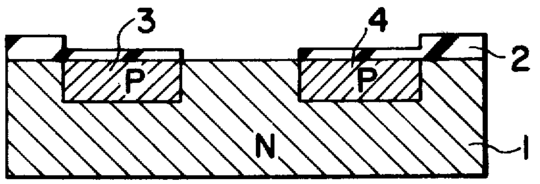
Figure 1D:
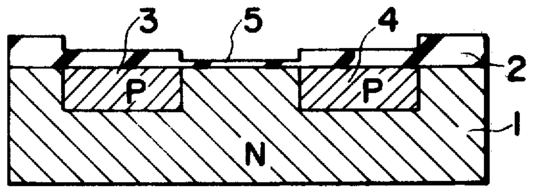
Figure 1E:
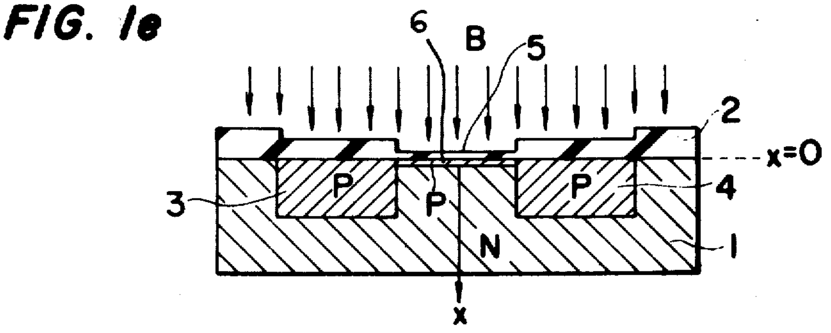

FIGS. 1*a* to 1*e* illustrate a manufacturing method in the case where the present invention is applied to a P-channel depletion type MOS field-effect transistor, and show the states of the semiconductor device at various steps in the sequence thereof.

a. An N-type silicon substrate 1 is prepared. The surface of the substrate is oxidized to form a silicon oxide film 2.

b. Parts of the silicon oxide film are removed by photoetching. Acceptors, for example boron atoms, are diffused into the exposed parts of the silicon substrate, to form a source region 3 and a drain region 4 of the P-type.

c. The oxide film on the substrate to become the gate portion between the source and drain is removed by the photoetching.

d. The substrate is subjected to thermal oxidation again, so that an oxide film 5 to become a gate insulating film is formed at the exposed part to a thickness of about 1,000 A.

e. (1) Boron ions are implanted into the substrate 1 through the oxide film 5, to form a P-type doped layer 6 in the surface portion of the substrate. The accelerating voltage of the boron ions at this time is 31 KeV, so that the maximum value of the impurity concentration distribution may lie at substantially the interface between the oxide film and the silicon substrate or within the substrate. P-type impurity concentration distribution curves in this case are as shown at one-dot chain lines (a) and (b) in FIG. 2. More desirably, however, the surface concentration is slightly smaller than the maximum value of the distribution. It can be selected within a range of from approximately 1/10 to 1. In the figure, the depth of the substrate is represented by $x$ with $x=0$ taken as the substrate surface. The maximum surface depletion layer depth at the impurity distribution is denoted by $x_{dmax}$. A part deeper than the depth $x_{dmax}$ is inverted into P-type, and becomes the cause of leakage current. Therefore, the P-type inversion is nullified by the succeeding implantation of phosphorus.

2. Phosphorus is subsequently implanted into the substrate through the oxide film, to form an N-type doped layer within the substrate. The accelerating voltage of phosphorus at this time is 163 KeV, and phosphorus is implanted at a surface density of $1.3 \times 10^{11}/cm^2$. In this case, the concentration distribution curve of the N-type impurity doped layer created by the implantation of phosphorus exhibits the maximum value at the depth $x_{dmax}$ as shown by broken lines (c) and (d) in FIG. 2. At the substrate surface part ($x=0$), the impurity concentration of the N-type doped layer is made sufficiently lower than that of the P-type doped layer. Also, at a part within the maximum surface depletion layer depth, the concentration of phosphorus is made sufficiently low as compared with that of boron, and the carrier density at this part is determined essentially by boron.

Since the impurities of the P-type doped layer and those of the N-type doped layer are of the opposite conductivity types, they cancel each other. As a result, concentration distribution curves as shown at thick lines (f) and (g) in the figure are obtained.

More specifically, the P-type impurities are cancelled by the N-type implanted impurities, so that the peak of the distribution may come close to the depth $x_{dmax}$. The former impurities are greatly reduced in concentration, and their concentration curve attenuates abruptly. Accordingly, the peak of the distribution of phosphorus of the N-type impurities is positioned substantially at $x_{dmax}$, and a somewhat shallower portion (at $x_j$) is precisely formed.

The performance of the implantation of the N-type impurities allows the P-N junction to be located at a depth of approximately 1,000 A from the silicon oxide film - silicon substrate interface. It is thus possible to form a P-N junction shallower than in the prior art.

On the other hand, the peak of the distribution of the N-type impurities introduced by the ion implantation lies at the inner silicon part beyond the silicon oxide film - silicon substrate interface (the silicon substrate surface), so that the implanted impurities have their concentration sufficiently lowered at the substrate surface. For this reason, the N-type impurities scarcely affect the P-type impurity concentration distribution in the vicinity of the silicon substrate surface before the implantation of the N-type impurities. In this connection, where the diffusion of phosphorus is adopted to effect the compensation for the uncontrollable channel region of the P-type, the impurity concentration distribution of phosphorus becomes greatest at the silicon substrate surface, and the impurity concentration at the silicon surface changes largely from the state before the diffusion of phosphorus.

Since the threshold voltage $V_T$ of the MOS field-effect transistor is determined by the concentration of carriers existing in a region from the semiconductor surface to the maximum surface depletion layer depth $x_{dmax}$, it depends on the impurity concentrations of boron and phosphorus implanted down to the maximum surface depletion layer depth $x_{dmax}$. In the case of the present invention, the impurity concentration of phosphorus in the aforesaid region is sufficiently low in comparison with that of boron, so that the threshold gate voltage $V_T$ is essentially determined by the implantation of boron.

Ion implanting apparatus is equipped with an implantation quantity-measuring instrument such as a beam monitor, and the quantities of implantation of boron and phosphorus can be accurately controlled. It is therefore possible to control the threshold voltage $V_T$ with high precision. In this case, either may precede in the manufacturing process between the ion implanting step of the N-type impurities and the doping step of the P-type impurities.

Figure 3:
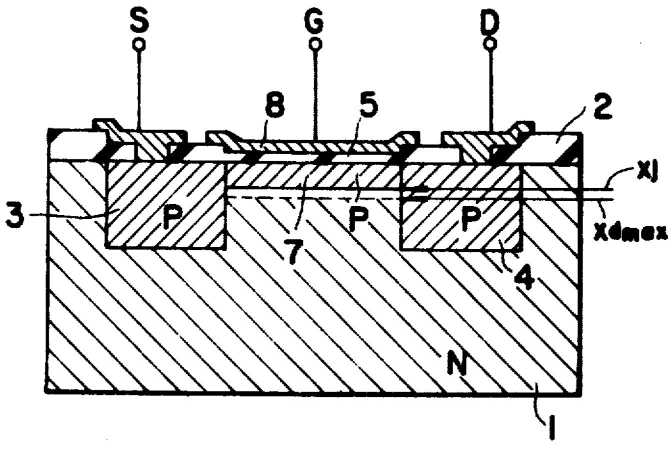
FIG. 3 is a vertical sectional view of the semiconductor device in FIG. 1 at its completion.

FIG. 3 shows the finished state of the MOS field-effect transistor manufactured by the foregoing method.

In the figure, reference numeral 7 designates a P-channel region, while 8 is a gate portion disposed on an insulating film 5. Electrodes and wirings S, D and G are provided which are respectively connected to a source 3, a drain 4 and the gate 8.

Figure 2:
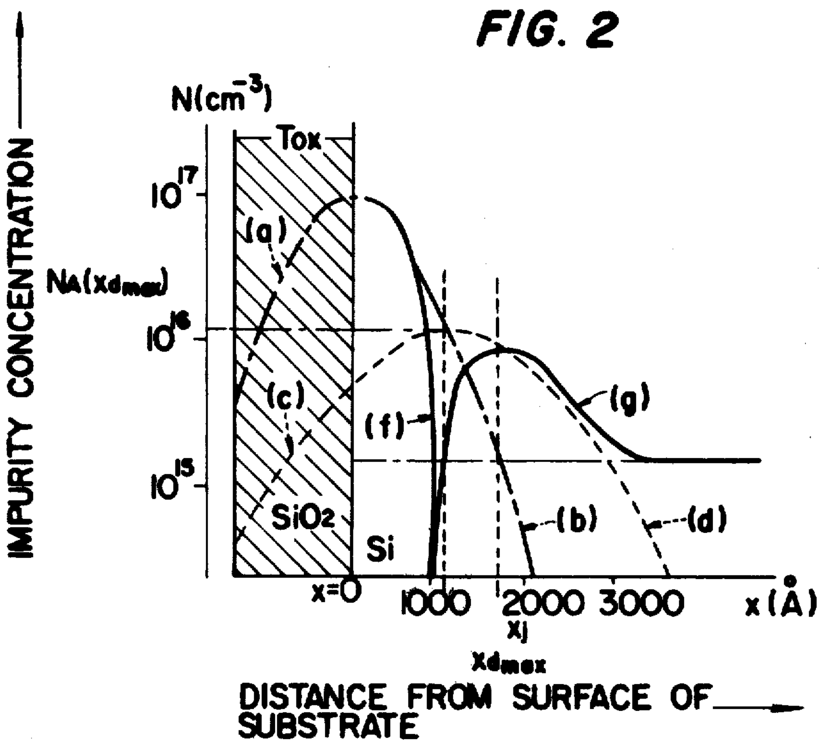
FIG. 2 is a diagram of impurity concentration distribution curves in the embodiment of the present invention.

In FIGS. 2 and 3, the depth $x_j$ indicates the position of the P-N junction after carrying out the implantation of phosphorus.

As explained above in conjunction with the embodiment, the present invention brings forth the following effects:

1. The impurity distribution along the depth of the semiconductor can be abruptly lowered in such a manner that the original impurity concentration at the semiconductor surface or in the vicinity thereof is hardly changed even by the implantation of phosphorus. Consequently, the position of the P-N junction can be precisely controlled. Simultaneously therewith, a shallow P-N junction can be formed.

2. The threshold gate voltage $V_T$ can be precisely controlled.

3. Owing to the effect (2), the leakage current of the depletion type MOS field-effect transistor can be diminished.

Although, in the foregoing embodiment, the ion implantation is utilized in the doping of boron for controlling the threshold voltage $V_T$ of the MIS field-effect transistor, the present invention can adopt the thermal diffusion technique etc. in the doping of boron.

Although, in the foregoing embodiment, the P-channel MOS field-effect transistor is referred to, the present invention can be similarly applied to an N-channel MOS field-effect element. For example, in order to reduce the source-drain leakage current $I_{DSL}$ in an N-channel depletion type MOS transistor manufactured by, e.g., carrying out the ion implantation of phosphorus into a channel region of an N-channel enhancement type MOS transistor which is produced by, e.g., making use of alumina ($Al_2O_3$) for a gate oxide film, the ion implantation of boron may be further performed in the vicinity of the maximum depletion layer depth $x_{dmax}$ of the channel region.

Figure 4A:
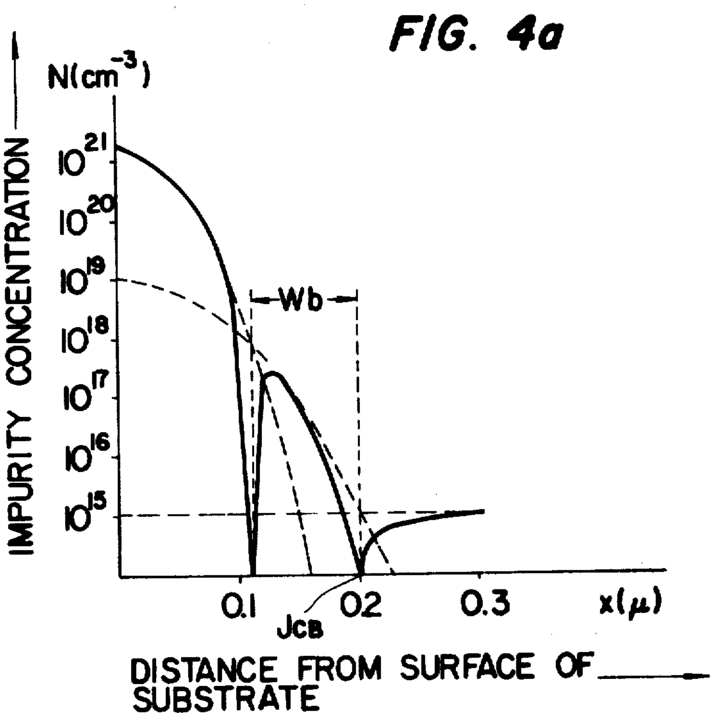
FIGS. 4*a* and 4*b* and FIGS. 5*a* and 5*b* are diagrams of the curves of impurity concentration distributions before implanting impurities (a) and after implanting them (b) in further embodiments of the present invention.
Figure 4B:
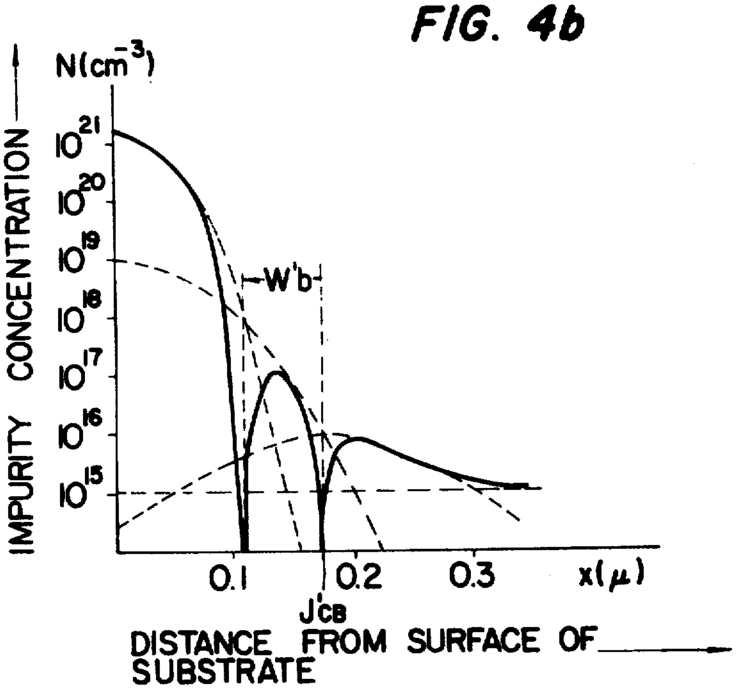

In addition to the control of the threshold voltage $V_T$ of the MIS field-effect transistor, the present invention is applicable to the following fields:

1. Bipolar transistor: In prior-art bipolar transistors, the impurity concentration distribution is as shown in FIG. 4*a*. The position $J_{CB}$ of the base-collector junction is subject to large fluctuations during manufacture, so that non-uniformity in the distributions of $f_T$ (cutoff frequency) and $h_{FE}$(current amplification factor) is large. When ion implantation is conducted so that the peak of the distribution may come into the vicinity of the base-collector junction $J_{CB}$, the position $J'_{CB}$ of the resultant base-collector junction is as shown in FIG. 4*b* and can have its precision increased. The non-uniformity in $f_T$ and $h_{FE}$ can therefore be made small. Furthermore, the base width $Wb$ can be greatly reduced to $W'b$, which makes it possible to produce transistors having high $f_T$ and $h_{FE}$.

Figure 5A:
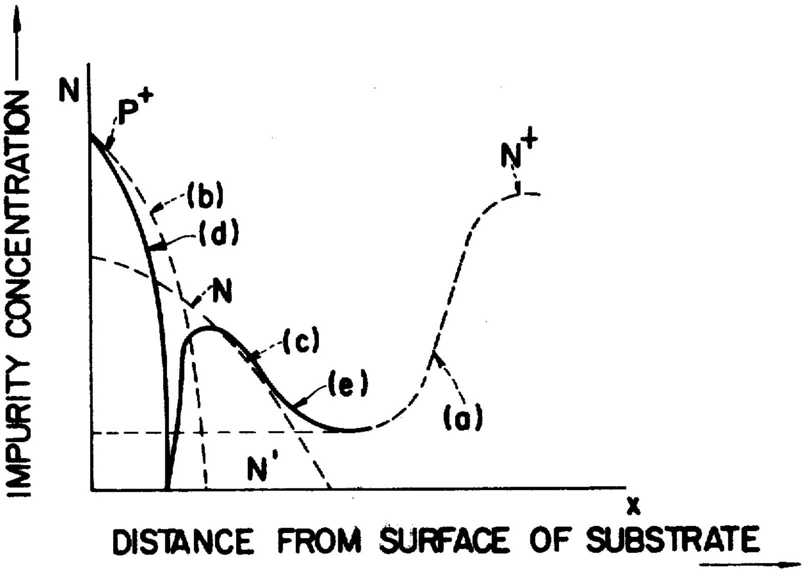
Figure 5B:
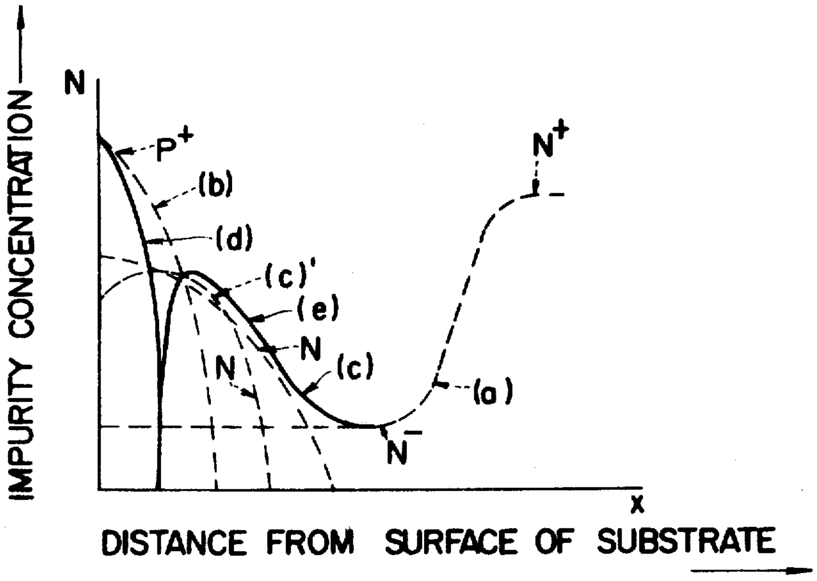
Figure 6:
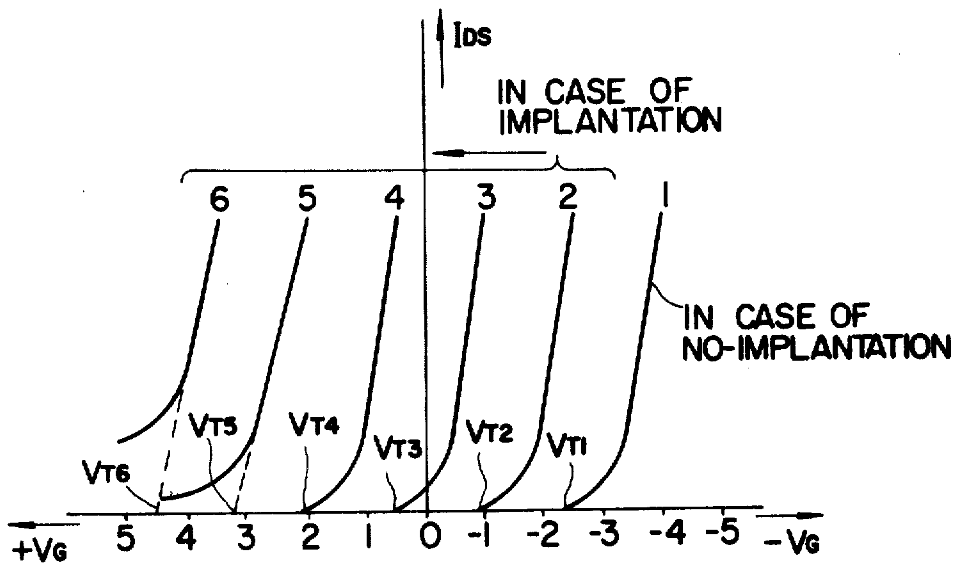
Figure 7:
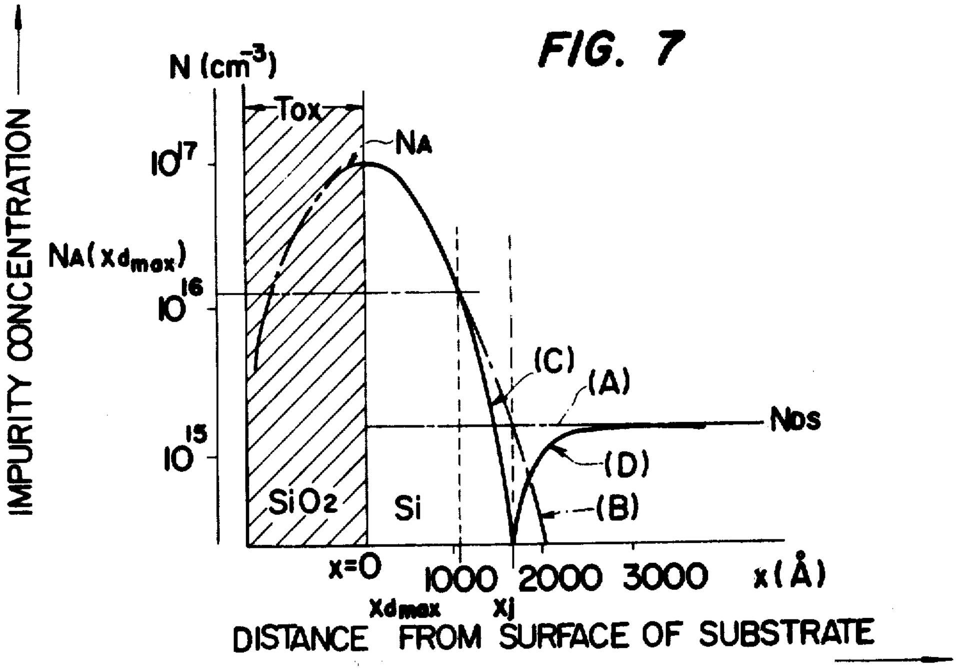
Figure 8:
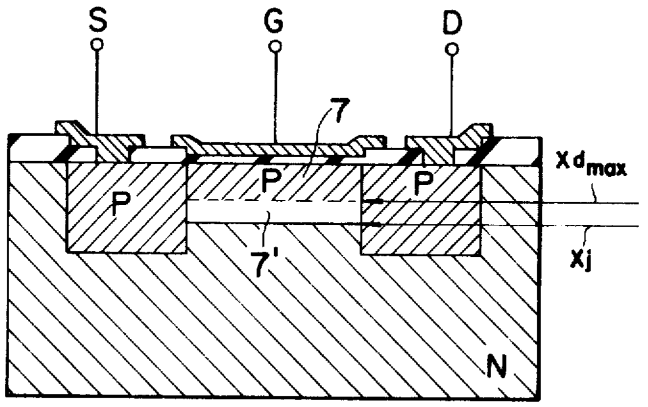
FIG. 8 is a vertical sectional view of a conventional MOS semiconductor device.
Figure 9:
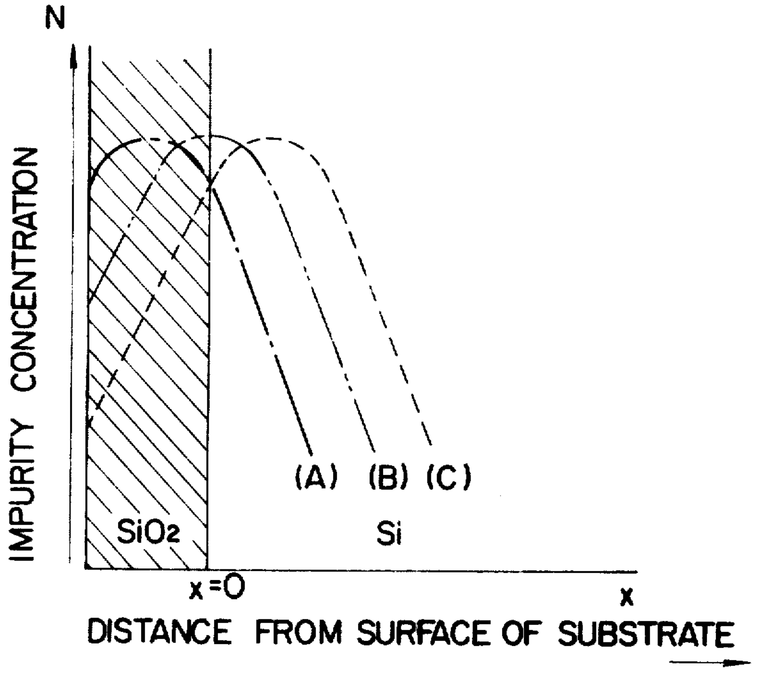
FIG. 9 is a diagram of impurity concentration distribution curves in ion implantation for controlling the threshold voltage $V_T$ of MOS semiconductor devices.

2. Variable capacitance diode: In a prior-art variable capacitance diode having a super abrupt junction by double diffusion, as shown at an impurity concentration distribution in FIG. 5*a*, ion implantation is further executed as shown at a curve (*c*)′ in FIG. 5*b*, and the gradient of the impurity concentration becomes larger. The capacitance variation index accordingly becomes larger, so that the sensitivity of the capacitance to voltage is enhanced.

3. Light emitting diode: As illustrated in FIG. 2, explained in the example of the MOS transistor, the formation of the very shallow P-N junction is possible in accordance with the present invention. With such a shallow P-N junction, light rays emitted therefrom are little absorbed since the distance to the surface is shorter than in the prior art. Thus, the radiation effect is enhanced.

While We have shown and described several embociments in accordance with the present invention, it is understood that the same is not limited thereto but is susceptible of numerous changes and modifications as known to a person skilled in the art, and We therefore do not wish to be limited to the details shown and described herein but intend to cover all such changes and modifications as are obvious to one of ordinary skill in the art.

What we claim is:

1. A method of manufacturing a depletion type MIS semiconductor device, comprising the steps of:

a. forming, in a semiconductor substrate of a first conductivity type with an insulating film on its surface, an impurity doped layer of a second conductivity type, being opposite to said first conductivity type, in which the impurity concentration becomes the greatest at a position of said substrate within a maximum surface depletion layer depth; and b. subjecting an impurity of the same conductivity type as said first conductivity type to ion implantation, so that the maximum value of the impurity distribution comes close to said maximum surface depletion layer depth, said impurity of said first conductivity type being of a quantity necessary for compensating the concentration of the impurity of said second conductivity type in the vicinity of said maximum surface depletion layer depth in said impurity doped layer of said second conductivity type.

2. A method of manufacturing a semiconductor device, comprising the steps of:

a. selectively introducing an impurity of a first conductivity type into a semiconductor substrate through a surface portion thereof, said substrate having a second conductivity type opposite said first conductivity type, so that the concentration gradient of said impurity of said first conductivity type in said substrate is at a prescribed maximum value substantially at the surface of said substrate and decreases therefrom into said substrate; and b. selectively introducing an impurity of said second conductivity type into said substrate through said surface portion thereof, so that the concentration gradient of said impurity of the second conductivity type in said substrate increases from a first prescribed level at the surface of said substrate, reaches a prescribed maximum value at an established distance from said surface and decreases therefrom into said substrate, said prescribed maximum value of the concentration gradient of said second conductivity type impurity being relatively smaller than the prescribed maximum value of the concentration gradient of the impurity of said first conductivity type;

whereby a resultant impurity concentration distribution from the combined effects of steps (a) and (b) is formed in said substrate, said resultant distribution having said first conductivity type at the surface of said substrate and decreasing to a defined distance within said substrate at which a P-N junction is formed.

3. A method according to claim 2, wherein step (a) comprises forming a layer of insulating material on said surface portion of said substrate and implanting ions of said first coonductivity type into said substrate through said insulating layer.

4. A method according to claim 2, wherein step (a) comprises thermally diffusing said impurity of said first conductivity type into said substrate through said surface portion thereof.

5. A method according to claim 2, wherein said step (b) comprises forming a layer of insulating material in said surface portion of said substrate and implanting ions of said second conductivity type into said substrate through said insulating layer.

6. A method according to claim 3, wherein said step (b) comprises implanting ions of said second conductivity type into said substrate through said insulating layer.

7. A method according to claim 4, wherein said step (b) comprises forming a layer of insulating material in said surface portion of said substrate and implanting ions of said second conductivity type into said substrate through said insulating layer.

8. A method according to claim 2, wherein said steps (a) and (b) are carried out so that the impurity concentration distribution for said first and second conductivity type impurities compensate each other at approximately the maximum surface depletion layer depth of said substrate.

9. A method according to claim 2, wherein the impurity concentration gradient of said impurity of the second conductivity type reaches its prescribed maximum value at approximately said defined distance within said substrate.

10. A method according to claim 2, wherein the prescribed maximum value of the concentration gradient of said impurity of the first conductivity type is approximately one to ten times that of the surface concentration of said impurities of the first conductivity type.

* * * * *